United States Patent
Giorgi et al.

(10) Patent No.: US 9,806,815 B2
(45) Date of Patent: Oct. 31, 2017

(54) OPTICAL SOURCE, COMMUNICATIONS NETWORK OPTICAL APPARATUS AND COMMUNICATIONS NETWORK BASE STATION

(71) Applicant: Telefonaktiebolaget LM Ericsson (publ), Stockholm (SE)

(72) Inventors: Luca Giorgi, Pisa (IT); Antonio D'Errico, Pisa (IT); Gianfranco Sfameni, Pisa (IT); Francesco Testa, Pisa (IT)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 15/311,913

(22) PCT Filed: May 23, 2014

(86) PCT No.: PCT/EP2014/060655
§ 371 (c)(1),
(2) Date: Nov. 17, 2016

(87) PCT Pub. No.: WO2015/176770
PCT Pub. Date: Nov. 26, 2015

(65) Prior Publication Data
US 2017/0093494 A1    Mar. 30, 2017

(51) Int. Cl.
*H04B 10/00* (2013.01)
*H04B 10/2507* (2013.01)
(Continued)

(52) U.S. Cl.
CPC ....... *H04B 10/2572* (2013.01); *H04B 10/532* (2013.01); *H04W 88/08* (2013.01)

(58) Field of Classification Search
CPC ..... H04B 10/50; H04B 10/501; H04B 10/503
See application file for complete search history.

(56) References Cited

U.S. PATENT DOCUMENTS

| 9,444,218 | B1* | 9/2016 | Huang | H01S 5/06821 |
| 2014/0064727 | A1* | 3/2014 | Presi | H04B 10/2572 398/49 |
| 2015/0311669 | A1* | 10/2015 | Chuang | H01S 5/0064 398/65 |

FOREIGN PATENT DOCUMENTS

EP    2637266 A1    9/2013

OTHER PUBLICATIONS

Cheng, Ning et al., "20Gb/s Hybrid TDM/WDM PONs with 512-Split Using SelfSeeded Reflective Semiconductor Optical Amplifiers", IEEE Optical Fiber Communication and Exposition and the National Fiber Optic Engineers Conference (OFC/NFOEC), Los Angeles, California, Mar. 4-8, 2012, 1-3.

(Continued)

*Primary Examiner* — Daniel Dobson
(74) *Attorney, Agent, or Firm* — Murphy, Bilak & Homiller, PLLC

(57) ABSTRACT

There is provided an optical source. The optical source comprises a reflective optical amplifier configured to generate an optical signal, the optical signal comprising an amplified spontaneous light emission having a plurality of light modes each having a respective wavelength. The optical source further comprises a reflective mirror, spaced from the reflective optical amplifier, and arranged to receive the optical signal and to rotate a polarization of each light mode in the received optical signal, to form a further optical signal. The optical source further comprises an optical power splitter arranged to receive the further optical signal and to split the further optical signal into a first optical signal which is directed to the reflective optical amplifier for amplification thereby, and a second optical signal. The optical source further comprises an output arranged to output the second optical signal. There is also provided a (Continued)

communications network optical apparatus and a communications network base station.

14 Claims, 4 Drawing Sheets

(51) Int. Cl.
H04B 10/532 (2013.01)
H04J 14/00 (2006.01)
H04W 88/08 (2009.01)

(56) References Cited

OTHER PUBLICATIONS

Gordon, J.P. et al., "PMD fundamentals: Polarization mode dispersion in optical fibers", PNAS, vol. 97, No. 9, Apr. 25, 2000, 4541-4550.

Le, S.D. et al., "Up to 60 km Bidirectional Transmission of a 16 Channels x 10 Gb/s FDM-WDM PON Based on Self-Seeded Reflective Semiconductor Optical Amplifiers", Optical Society of America, Optical Fiber Communications Conference and Exhibition (OFC), Mar. 9-13, 2014, 1-3.

Michie, C. et al., "Reflective Semiconductor Optical Amplifiers for Passive Optical Networks", IEEE 11th International Conference on Transparent Optical Networks (ICTON), Aug. 2009, 1-4.

Narasimha, Adithyaram et al., "An Ultra Low Power CMOS Photonics Technology Platform for H/S Optoelectronic Transceivers at less than $1 per Gbps", Optical Fiber Communication Conference 2010, San Diego, CA, Mar. 21-25, 2010, 1-3.

Presi, Marco et al., "Stable self-seeding of R-SOAs for WDM-PONs", Optical Society of America, Optical Fiber Communication Conference/National Fiber Optic Engineers Conference 2011, Los Angeles, California, Mar. 6-10, 2011, 1-3.

Ruiz, M. et al., "Reflective semiconductor optical amplifier submitted to strong optical feedback and coupled to long external cavity", Proceedings of SPIE 8980, Physics and Simulation of Optoelectronic Devices XXII, Mar. 2014, 1-9.

* cited by examiner

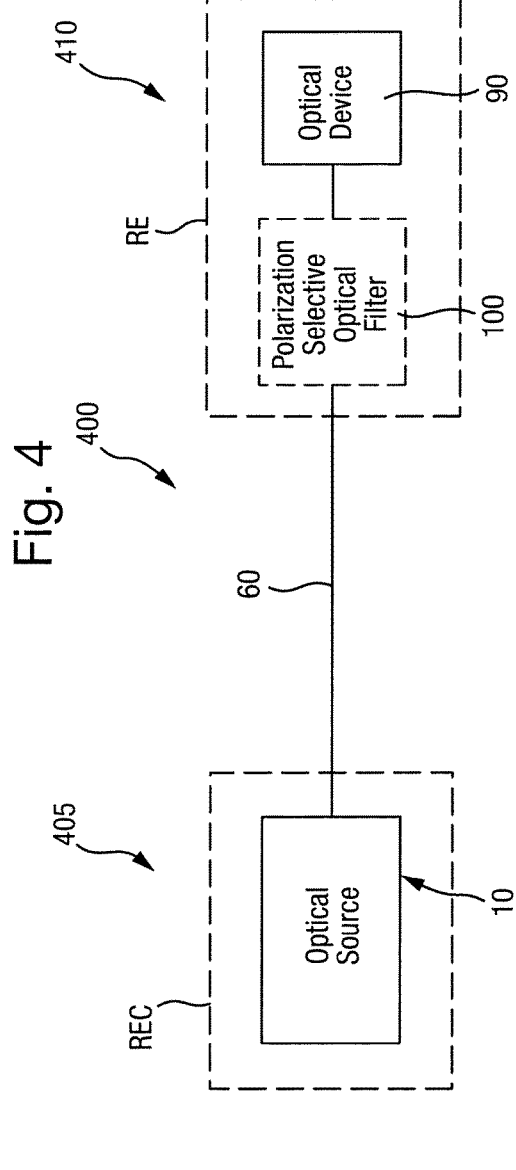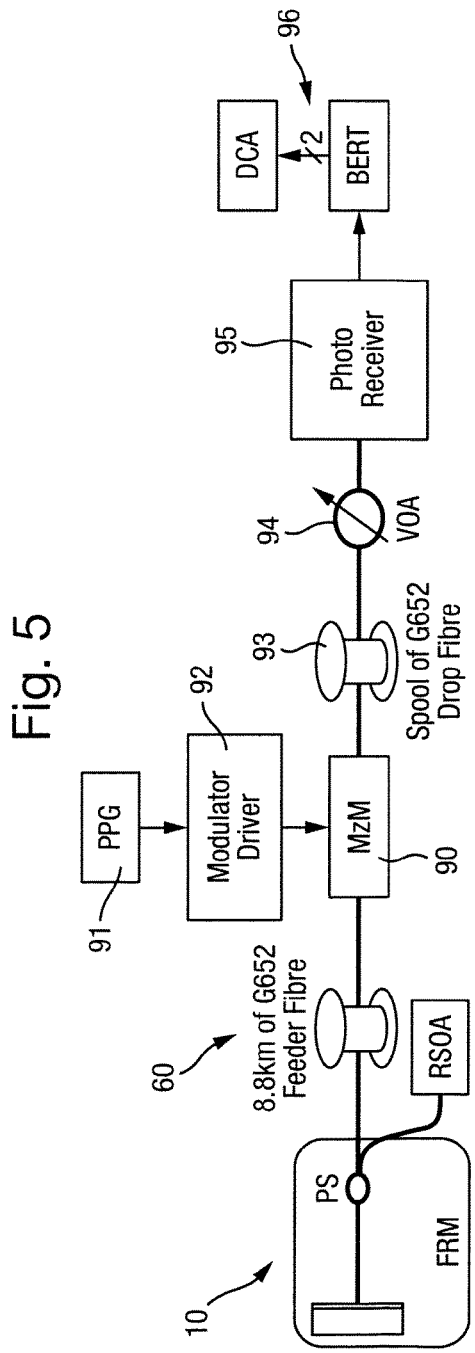

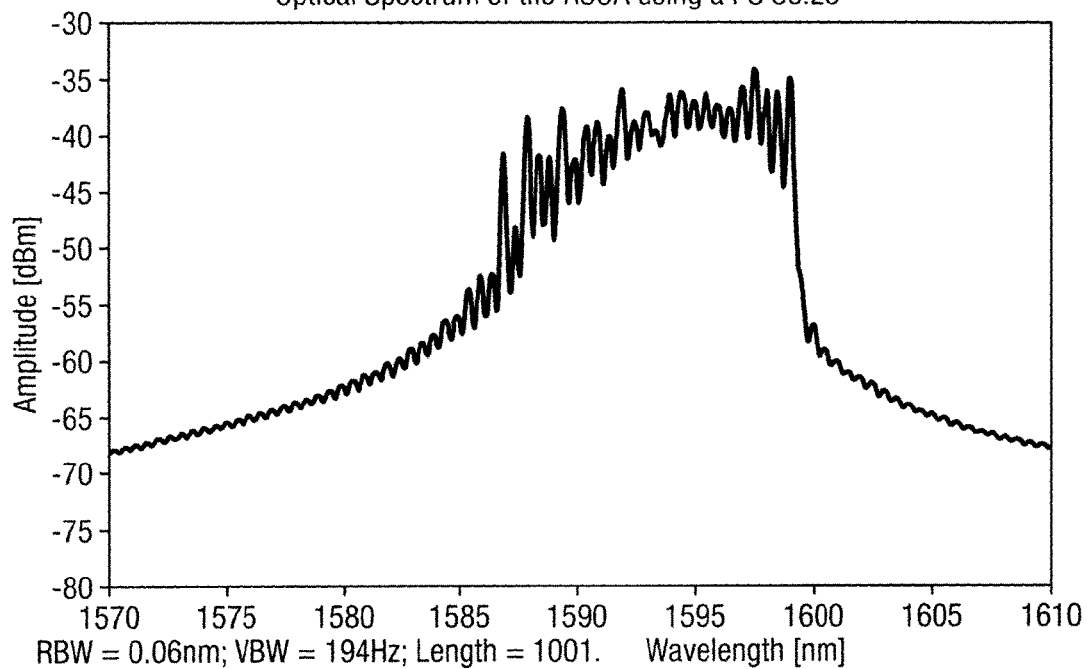
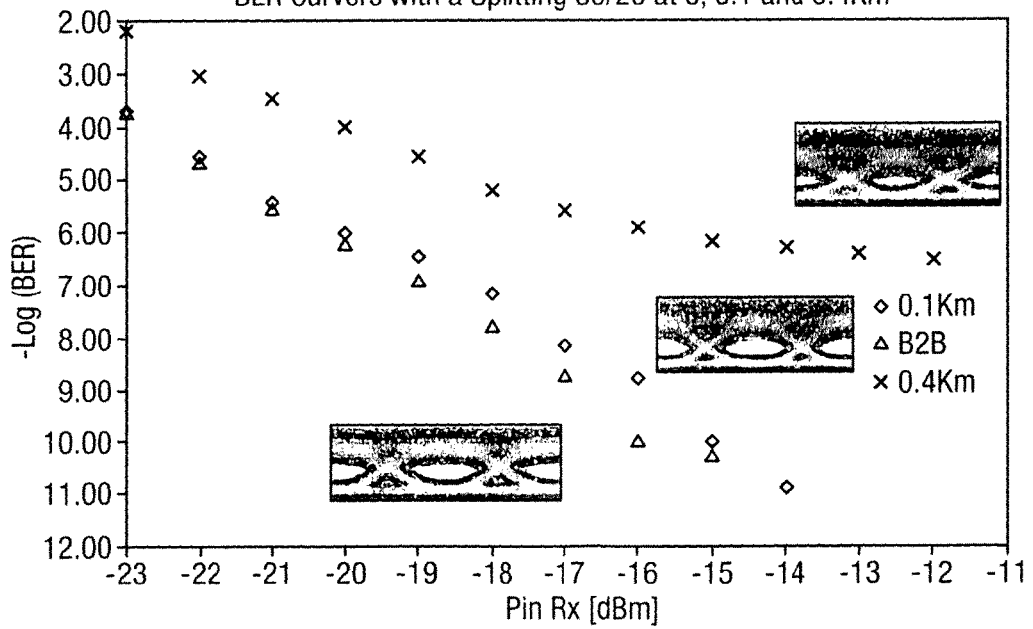

OPTICAL SOURCE, COMMUNICATIONS NETWORK OPTICAL APPARATUS AND COMMUNICATIONS NETWORK BASE STATION

TECHNICAL FIELD

The present invention relates to an optical source, a communications network optical apparatus comprising the optical source and a communications network base station.

BACKGROUND

When a continuous wave, CW, optical signal has to be delivered to a single polarization device, SPD, for example an optical modulator, normally either a polarization maintaining fibre, PMF, pigtail is provided on both the device and the laser source to be connected or the laser source is directly integrated in the optical device itself, so that the state of polarisation of the optical signal is fully defined and can easily be aligned with the required polarization direction of the optical device. Connection using PMF has been widely adopted in many applications where the distance between the laser source and the optical device is short, typically up to few meters, because the laser source and the optical device are located in the same hardware module or in the same equipment. The laser integration option has been adopted in a new low cost, silicon photonics parallel optic transceiver reported by A. Narasimha et al, "An Ultra Low Power CMOS Photonics Technology Platform for H/S Optoelectronic Transceivers at less than $1 per Gbps", Proc. OFC 2010, paper OMV4.

In communications network base station optical interconnections between a radio equipment controller, REC, (which may also be referred to as a baseband unit) and a radio equipment, RE, (which may also be referred to as a remote radio unit) the length of the optical link can reach up to 10 Km. In such applications it is convenient to place the laser source for the RE optical modulator in the REC cabinet, where the operating temperature range is controlled by a cooling system, and to supply the optical signal to the optical modulator remotely. If the laser source is coupled to the RE optical modulator using single mode fibre, SMF, a few km long, the state of polarization, SOP, of the optical signal will randomly fluctuate in time due to temperature and external force-induced birefringence variations along the fibre. A polarizer may be provided in front of the RE optical modulator to select the correct polarization component but SOP fluctuations in the SMF can cause large intensity variations to occur at the polarizer output, preventing good performance of a single-polarization device such as the RE optical modulator. In this case the use of a long length (up to 10 Km) of PMF may be not acceptable due to the higher cost involved (around 30 times more than using SMF) and the higher attenuation of PMF as compared to SMF. The use of SMF is therefore preferred.

SUMMARY

The Applicant has appreciated that one way of addressing the above-identified problem is to use an unpolarised light source as the remote light or optical source. Using an unpolarised light source, the transmitted optical signal may have a uniform distribution of optical power in respect of each possible SOP, even when the optical signal is transmitted through SMF, since the electric field of the generated light may vibrate in all possible different directions in the cross-section of the fibre core, orthogonal to the propagation direction of the light. An example of an unpolarised optical source is a semiconductor optical amplifier, SOA, which produces an amplified spontaneous light emission, ASE.

However, the applicant has further appreciated that a problem with this approach is that unpolarised ASE light generated by a SOA has a wide bandwidth spectrum (typically greater than 70 nm), which means that it may not be possible to transmit the generated optical signal over a sufficiently long SMF (e.g. up to 10 km) with good performance, due to chromatic dispersion.

One solution to address this problem is to use a laser to generate a large number of longitudinal modes (with tighter harmonics than ASE light), the electric field generated by each mode vibrating in all possible directions. However, a problem with this solution is that due to the non-linear phenomenon of mode competition, a costly and complex optical source configuration is required in order to monitor and control mode competition, as for example described in M. Presi and E. Ciaramella, "Stable self-seeding of r-soas for wdm-pons" in Optical Fiber Communication Conference and Exposition (OFC/NFOEC), 2011 and the National Fiber Optic Engineers Conference, (IEEE), OMP4, pp 1-3.

The present invention aims to provide an improved optical source.

According to the present invention, there is provided an optical source. The optical source comprises a reflective optical amplifier configured to generate an optical signal, the optical signal comprising an amplified spontaneous light emission having a plurality of light modes each having a respective wavelength. The optical source further comprises a reflective mirror, spaced from the reflective optical amplifier, and arranged to receive the optical signal and to rotate a polarisation of each light mode in the received optical signal, to form a further optical signal. The optical source further comprises an optical power splitter arranged to receive the further optical signal and to split the further optical signal into a first optical signal which is directed to the reflective optical amplifier for amplification thereby, and a second optical signal. The optical source further comprises an output arranged to output the second optical signal.

Advantageously, embodiments of the present invention may enable the generation of unpolarised light with a narrower bandwidth spectrum than pure ASE light, in a simpler and more cost effective manner. Thus, embodiments of the present invention may, advantageously, enable the output optical signal (i.e. the second optical signal) to be transmitted across up to tens of km of SMF while maintaining the optical power associated with a preselected SOP within a preselected range, which may allow good performance of a single-polarisation photonic device (such as a modulator) provided at the end of a feeder fibre.

In embodiments of the present invention, the reflective optical amplifier is configured to apply an amplification gain to each light mode in a said first optical signal having the same polarisation as the respective light mode in the amplified spontaneous light emission.

In preferred embodiments of the present invention, the reflective mirror may comprise a faraday rotator mirror.

In preferred embodiments of the present invention, the reflective mirror may be arranged to rotate the polarisation of each light mode in the received light signal by 90 degrees. In this example, therefore, every two roundtrips the light modes may re-enter (i.e. be received by) the reflective optical amplifier at their original polarisation states, and thus a lasing effect may occur, as will be described in more detail below. It should be noted that, since the distance between the reflective optical amplifier and the rotator mirror may for example be in the order of a few meters, the round trip time of the light modes will typically be in the order of ns, whereas polarisation fluctuations typically occur on timescales in the range of s/ms.

In a preferred embodiment of the present invention, the optical power splitter may further be arranged to receive the optical signal generated by the reflective optical amplifier and to direct the optical signal to the reflective mirror. Thus, advantageously, the optical signal generated by the reflective optical amplifier, and received by the reflective mirror, may travel over the same waveguide as the optical signal reflected back to the reflective optical amplifier from the reflective mirror. This may provide a cost effective implementation.

In a preferred embodiment of the present invention, the optical power of the first optical signal may be greater than the optical power of the second optical signal. For example, preferably, the ratio of the optical power of the first optical signal and the optical power of the second optical signal may be 80:20. As will be discussed further below, this optical power splitting ratio may be selected based on a trade-off between the bandwidth of the output (second) optical signal and the power of the output optical signal.

In an embodiment of the present invention, the optical source may further comprise an optical amplifier arranged to amplify the second optical signal, wherein the amplified second optical signal is output from the output. In some cases, including an optical amplifier to amplify the second optical signal may be disadvantageous, since its inclusion may negatively affect overall system performance. However, the applicant has appreciated that, if competition mode phenomena arises among the generated modes due to imperfections in the cavity structure, the random power fluctuations associated with particular SOPs may, advantageously, be reduced by adding such an optical amplifier.

In this embodiment, the optical source may further comprise a band-pass filter arranged to filter the amplified second optical signal, wherein the filtered amplified second optical signal is output from the output. This may avoid transmitting unwanted noise.

In embodiments of the present invention, the optical source may further comprise a feeder optical fibre, preferably a single mode fibre, SMF, coupled at one end to the output.

The reflective optical amplifier may comprise a reflective semiconductor optical amplifier, RSOA.

There is further provided a communications network optical apparatus comprising an optical source as described above, and an optical device arranged to operate at a preselected state of polarisation and to receive at least a portion of a said second optical signal output by the optical source.

The optical source may further comprise a polarisation selective optical filter arranged to receive the second optical signal output by the optical source and to transmit a portion of the second optical signal having the preselected state of polarisation to the optical device.

There is further provided a communications network base station comprising the communications network optical apparatus as described above.

DESCRIPTION OF THE DRAWINGS

Embodiments of the present invention will now be described, by way of example only, with reference to the following drawings:

FIG. 4 shows a communications network optical apparatus, which may be included in a communications network base station, according to a preferred embodiment of the present invention;

FIG. 5 shows an experimental testing set up of a communications network optical apparatus according to an embodiment of the present invention;

FIG. 8 is a graph showing the bandwidth spectrum of the reflective optical amplifier, when an optical power splitting ratio of 80:20 is used; and FIG. 9 is a graph showing BER versus received optical signal power, when an optical power splitting ratio of 80:20 is used, when the optical signal is transmitted over different lengths of feeder optical fibre.

DETAILED DESCRIPTION

Figure 1:
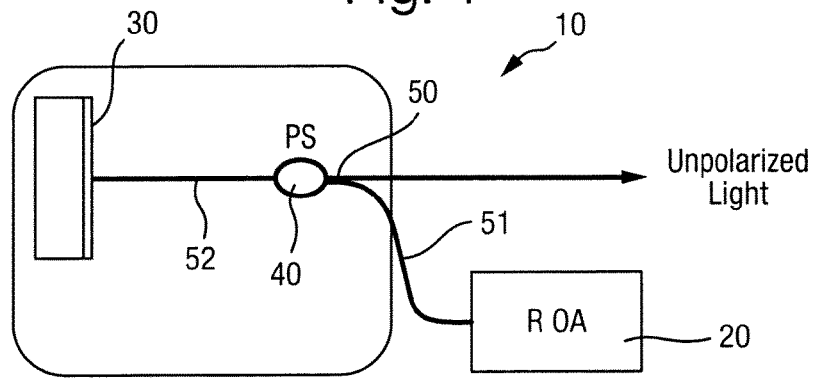
FIG. 1 shows an optical source according to a preferred embodiment of the present invention.

FIG. 1 illustrates an optical source 10 according to a preferred embodiment of the present invention.

The optical source 10 comprises a reflective optical amplifier 20 (ROA). In this example, the reflective optical amplifier 20 is a semiconductor optical amplifier (RSOA). The ROA 20 is configured to generate an optical signal, the optical signal comprising an amplified spontaneous light emission (ASE) having a plurality of light modes each having a respective wavelength. The optical source 10 further comprises a reflective mirror 30, which is spaced from the reflective optical amplifier 20, and arranged to receive the optical signal and to rotate a polarisation of each light mode in the received optical signal, to form a further optical signal. The reflective mirror 30 may be a faraday rotator mirror. There is further an optical power splitter 40 which is arranged to receive the further optical signal and to split the further optical signal into a first optical signal which is directed to the reflective optical amplifier for amplification thereby, and a second optical signal. There is an output 50 arranged to output the second optical signal.

The reflective optical amplifier 20 is configured to apply an amplification gain to each light mode in a said first optical signal having the same polarisation as the respective light mode in the amplified spontaneous light emission (i.e. having its original polarisation state).

Since the ROA 20 is configured to generate an amplified spontaneous light emission, ASE, there is a high probability that each of the generated light modes (which may also be referred to below as wavelengths) will have a different polarisation state from the other light modes, and thus that the light will be "unpolarised". When a light mode re-enters the ROA 20 with its original polarisation state (and at a cavity peak gain), then a lasing effect will occur. Since the reflective mirror 30 rotates the polarisation of each light mode in the received optical signal, each light mode or wavelength will need to complete multiple round trips (i.e. to the reflector mirror 30 and back to the ROA 20) before reaching the ROA 20 with its original polarisation state. For example, in a preferred embodiment of the present invention, the reflective mirror 30 may be arranged to rotate the polarisation of each light mode in the received optical signal by 90 degrees. Thus, in this example, each light mode will need to complete two round trips before re-entering the ROA 20 with its original polarisation state. However, other degrees of polarisation rotation are possible.

This arrangement results in a phenomenon whereby there is a cut off condition in the ROA 20, such that the lasing modes (which are then output from output 50) are restricted to a narrowed spectrum bandwidth. There may exist a very short transitory period where all of the wavelengths in an initial ASE having a broader bandwidth may try to win and reach output 50. However, very soon those wavelengths far from the cavity peak gain will be suppressed, and the others will share the total amount of energy in the ROA 20.

Thus, advantageously, embodiments of the present invention may enable the generation of unpolarised light, with a narrower bandwidth, in a simpler and more cost effective manner than previous proposals. For example, in a preferred embodiment of the present invention, as shown in the graph of FIG. 8, the bandwidth spectrum of the output light may be reduced to 15 nm, dependent for example on the cavity length of the optical source 10 and the power split ratio of the optical power splitter 40, as will be described further below.

As indicated above, the reflective optical amplifier 20 may be a reflective semiconductor optical amplifier RSOA, which may comprise an III-V material. It will appreciated that the central wavelength of the lasing emission will depend on the optical field distribution inside the active region of the RSOA. The reflective optical amplifier 20 may further have a non-zero polarisation dependent gain (PDG), for example a PDG of 1 dB.

In this example, the optical source 10 further comprises a first optical waveguide 51, which couples the ROA 20 and the optical power splitter 40, and a second optical waveguide 52, which couples the optical power splitter 40 and the reflective mirror 30. These optical waveguides 51, 52 may for example comprise semiconductor optical waveguides, or optical fibres, and these optical waveguides 51, 52 may, for example, have a combined length in the order of a few meters. It should be appreciated that the effects of polarisation fluctuations will not be significant over these distances, as the round trip time of the light modes over these waveguides will be in the order of ns, whereas polarisation fluctuations typically occur over timescales in the range of s/ms.

In this example, the optical source 10 is configured such that the optical signal generated (i.e. output) by the ROA 20 travels, over the first optical waveguide 51, such that the optical signal is received by the optical power splitter 40. The optical power splitter 40 is further configured to direct the optical signal to the reflective mirror 30, over the second optical waveguide 52. Further, in this example, the reflective mirror 30 is arranged such that the optical signal reflected back from the reflective mirror 30 (the further optical signal) also travels over the second optical waveguide 52 to optical power splitter 40, and the optical power splitter 40 is arranged such that the first optical signal split off by the optical power splitter 40 also travels over the first optical waveguide 51 to ROA 20 (i.e. over the same optical waveguide as the optical signal generated and output by the ROA 20). This arrangement is advantageous as it may be simpler than alternative arrangements and may reduce the length of optical waveguides required. However, alternative arrangements are possible, and for example the outgoing and return optical signals could travel over different optical waveguides.

In this example, the output 50 is the output port of the optical power splitter 40 configured to output the second optical signal. However, in alternative embodiments, the output 50 may be spaced from, and coupled to the output port of the optical power splitter 40.

Figure 2:
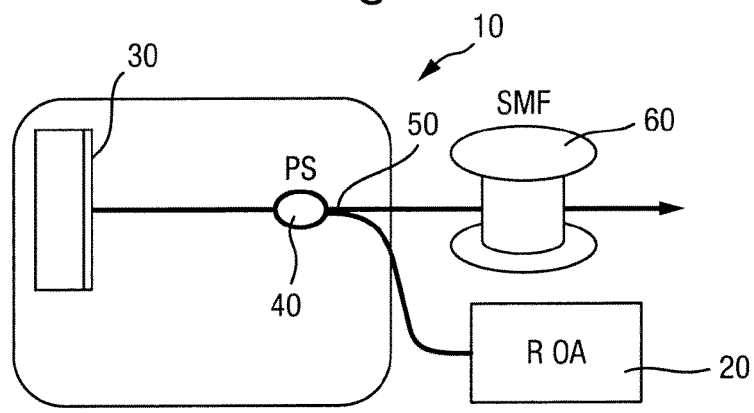
FIG. 2 shows the optical source having a feeder optical fibre coupled at one end to the output.
Figure 3:
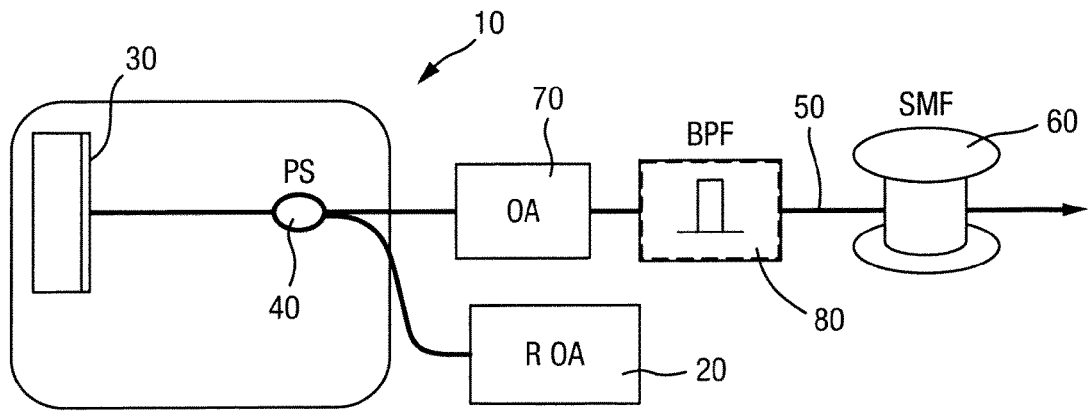
FIG. 3 shows an optical source according to a further preferred embodiment of the present invention.

FIG. 2 shows the optical source 10 where a feeder optical fibre 60 is coupled at one end to the output 50 (and therefore in this example to optical power splitter 40). In this example, the feeder optical fibre 60 is single mode polarisation fibre (SMF). This feeder optical fibre 60 may for example have a length up to 10 km.

Figure 6:
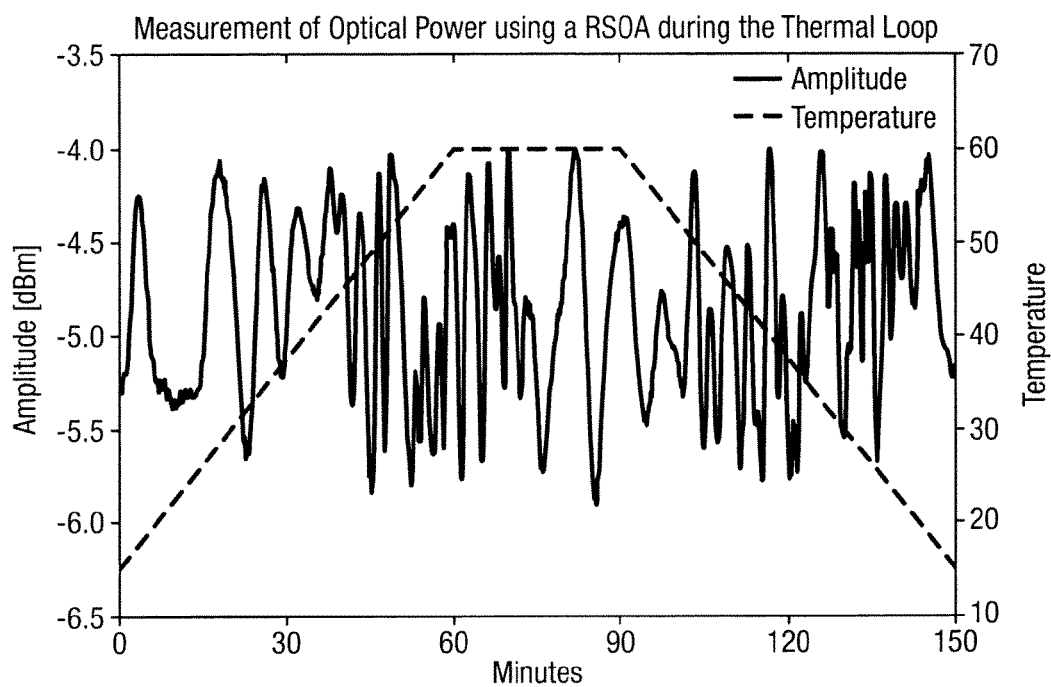
FIG. 6 is a graph showing the power fluctuations of selected SOPs in the second optical signal, after transmission over a feeder optical fibre.

FIG. 6 is a graph showing the power fluctuations over time of a selected SOP in the output (second) optical signal after transmission over a SMF feeder fibre 60 of, in this example, 8.8 km. In this test, the feeder fibre 60 was placed in a thermal chamber in order to stimulate polarisation variation in the SMF. A polariser was coupled to the other end of the feeder fibre 60, to select the wanted SOP, and a polarimeter, coupled to the polariser, was used to measure the amplitude variation of the polariser output (i.e. of the selected SOP). In this example, it is seen that the power fluctuations of the selected SOP are less than 2 dB.

Thus, advantageously, it is seen that embodiments of the present invention may enable an optical signal to be transmitted across a length of SMF, e.g. up to tens of km of SMF, while maintaining the optical power associated with a pre-selected SOP within a preselected range, which may allow good performance of a single-polarisation optical device (e.g. a modulator) provided at the end of the feeder fibre 60.

The optical power splitter 40 may be configured to split the power of the further optical signal according to any one of a number of power split ratios, which may be selected based on a trade-off between the bandwidth of the output (second) optical signal and the power of the second optical signal. As the power of the first optical signal (i.e. the portion of the further optical signal directed back to the ROA 20) increases, so the bandwidth of the output optical signal may advantageously decrease. However, it follows that the power of the output optical signal (i.e. the second optical signal) will also decrease.

It has been found that it may be preferable for the optical power of the first optical signal to be greater than the optical power of the second optical signal and, more preferably, that the ratio of the optical power of the first optical signal and to the optical power of the second optical signal is 80:20.

FIG. 5 illustrates an experimental set up which was used to test different optical power splitting ratios. In this example, a 1550 nm RSOA was used as the ROA 20, having Psat of 1.5 dBm, Gain of 17 dB and PDG of 1 dB. Further, a feeder fibre 60 of G652 SMF of 8.8 km was coupled at one end to the output 50 of the optical source 10. At its other end, the feeder fibre 60 was coupled to a Mach zehnder Modulator, MzM, 90 (an example of a single-polarisation optical device), which was configured to modulate the ULS's amplitude with a $2^{31}$-1 pseudo-random binary sequence (PRBS) at 9.953 Gb/s. A modulator drive 92, with a bandwidth of 12.5 GHz, was further located between a pattern generator (PDG) 91 and the MzM 90 to adjust the driving radio frequency electrical level. The modulated optical signal was transmitted over a spool of G652SMF, and then detected by a photo receiver 95 (a PIN with 7.86 GHz electrical bandwidth). A variable optical attenuator (VOA) 94 was placed in front of the receiver 95 to adjust the power level of the modulated optical signal. The output electrical signal was then passed to a bit error rate, BER, tester 96, to analyse the system performance.

Figure 7:
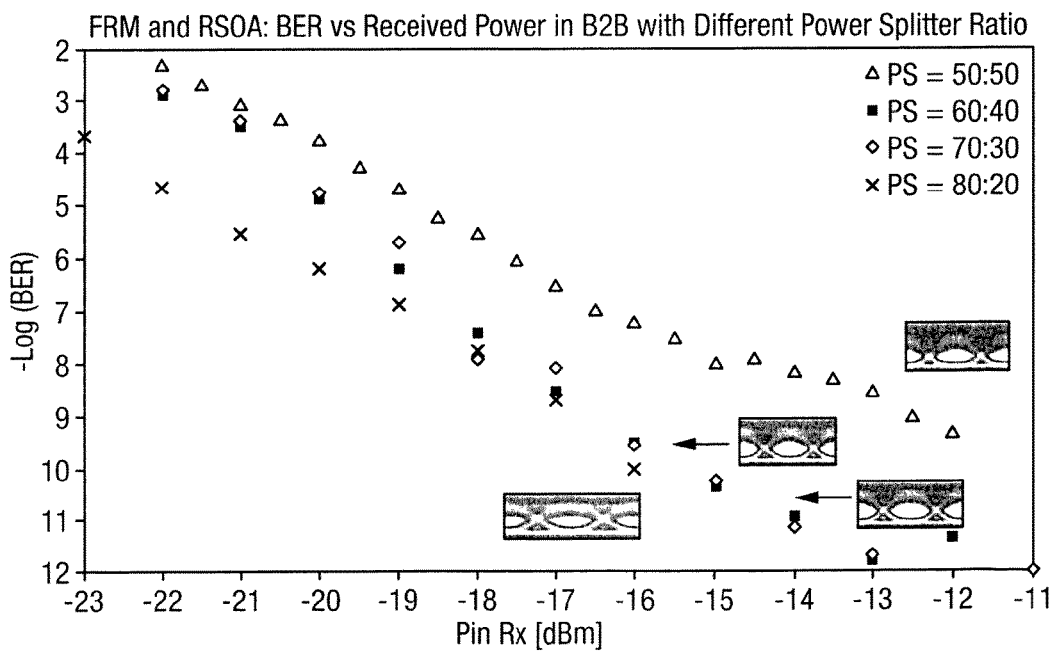
FIG. 7 is a graph showing bit error rate (BER) versus received optical signal power for different optical power splitting ratios of the optical power splitter.

FIG. 7 is a graph showing the BER versus received optical power, when different power split ratios were used in the optical power splitter 40 (and, in this case, where drop fiber 93 has a negligible length). Results are shown for the power split, PS, ratios: PS=50:50 (first optical signal:second optical signal), PS=60:40, PS=70:30 and PS=80:20.

It is seen that, in this example, the best system performance was obtained with a power split ratio of 80:20. It was also found however that it was not advantageous to further increase the portion of the power in the first optical signal (directed back to the ROA 20), since then an optical amplifier may be required at the optical source 10 output 50 in order to obtain a required optical power of the output optical signal, which may decrease overall system performance.

FIG. 9 further shows a BER versus received optical power graph, where a PS of 80:20 was used, with different lengths of optical drop fibre 93: 0 km, 0.1 km and 4 km. It is seen that, in this example, a similar system performance was found for a 0.1 km drop fibre as for a 0 km drop fiber. The use of a 4 km drop fibre, in this example, reduced overall system performance.

FIG. 4 shows a further example of an optical source 10 according to a further preferred embodiment of the present invention. In this example, the optical source 10 further comprises an optical amplifier, OA, 70 arranged to amplify the second optical signal, and an optional band-pass filter 80 arranged to filter the amplified second optical signal, wherein the filtered amplified second optical signal is output from the output 50. In this example, the OA 70 may be a semiconductor optical amplifier, and the OA 70 may be coupled to the optical power splitter 40, and the band-pass filter 80 coupled to the OA 70, by an optical waveguide, or for example these components could be integrated in the optical power splitter 40. Preferably, the band-pass filter 80 may have a bandwidth approximately the same as the bandwidth of the non-amplified second optical signal.

In some embodiments, the inclusion of this OA 70 may be advantageous as it may reduce random power fluctuations associated with a particular SOP, where some competition mode phenomenon occurs. The OA 70 may be operated in its saturation region, and may act as a power stabiliser leveraging on its gain compression.

FIG. 4 shows a communications network optical apparatus 400 according to an embodiment of the present invention.

The communications network optical apparatus 400 comprises an optical source 10 as described above. In this example, a feeder optical fibre 60 is coupled at one end to the output 50 of the optical source 10. The communications network optical apparatus 400 further comprises an optical device 90 arranged to operate at a preselected state of polarisation and to receive at least a portion of a said second optical signal output by the optical source 10. This optical device 90 may be referred to as single-polarisation device, and may for example, although not exclusively, comprise a modulator. In this example the optical device 90 is coupled to the other end of the feeder optical fibre 60.

Further, in this example, the communications network optical apparatus 400 further comprises an optional polarisation selective optical filter 100 (which may be called a polariser) arranged to receive the second optical signal output by the optical source 10 and to transmit a portion of the second optical signal having the preselected state of polarisation to the optical device 90. Thus, in this example, the other end of the feeder optical fibre 60 is directly coupled to the polarisation selective optical filter 100, which is coupled to optical device 90.

Advantageously, therefore, the optical source 10 may be remote from the optical device 90, and for example located in a temperature controlled environment.

In this example, the communications network optical apparatus 400 is comprised within a communications network base station. In particular, the optical source 10 may be located in a temperature controlled cabinet at a REC 405 (or baseband unit), and the optical device 90 (and polarisation selective optical filter 100) may be located at an RE 410 (also known as a remote radio unit). However, other implementations are possible.

The invention claimed is:

1. An optical source comprising:
   a reflective optical amplifier configured to generate an optical signal, the optical signal comprising an amplified spontaneous light emission having a plurality of light modes each having a respective wavelength;
   a reflective mirror, spaced from the reflective optical amplifier, and arranged to receive the optical signal and to rotate a polarization of each light mode in the received optical signal, to form a further optical signal;
   an optical power splitter arranged to receive the further optical signal and to split the further optical signal into a first optical signal which is directed to the reflective optical amplifier for amplification thereby, and a second optical signal; and
   an output arranged to output the second optical signal.

2. The optical source according to claim 1, wherein the reflective optical amplifier is configured to apply an amplification gain to each light mode in said first optical signal having the same polarization as the respective light mode in the amplified spontaneous light emission.

3. The optical source according to claim 1, wherein the reflective mirror comprises a faraday rotator mirror.

4. The optical source according to claim 1, wherein the reflective mirror is arranged to rotate the polarization of each light mode in the received optical signal by 90 degrees.

5. The optical source according to claim 1, wherein the optical power splitter is further arranged to receive the optical signal generated by the reflective optical amplifier and to direct the optical signal to the reflective mirror.

6. The optical source according to claim 1, wherein the optical power of the first optical signal is greater than the optical power of the second optical signal.

7. The optical source according to claim 6, wherein a ratio of the optical power of the first optical signal and the optical power of the second optical signal is 80:20.

8. The optical source according to claim 1, further comprising an optical amplifier arranged to amplify the second optical signal, wherein the amplified second optical signal is output from the output.

9. The optical source according to claim 8, further comprising a band-pass filter arranged to filter the amplified second optical signal, wherein the filtered amplified second optical signal is output from the output.

10. The optical source according to claim 1, further comprising a feeder optical fiber coupled at one end to the output.

11. The optical source according to claim 1, wherein the reflective optical amplifier comprises a reflective semiconductor optical amplifier (RSOA).

12. A communications network optical apparatus, comprising:
    an optical source comprising:

a reflective optical amplifier configured to generate an optical signal, the optical signal comprising an amplified spontaneous light emission having a plurality of light modes each having a respective wavelength;

a reflective mirror, spaced from the reflective optical amplifier, and arranged to receive the optical signal and to rotate a polarization of each light mode in the received optical signal, to form a further optical signal;

an optical power splitter arranged to receive the further optical signal and to split the further optical signal into a first optical signal which is directed to the reflective optical amplifier for amplification thereby, and a second optical signal; and an output arranged to output the second optical signal; and an optical device arranged to operate at a preselected state of polarization and to receive at least a portion of said second optical signal output by the optical source.

13. The communications network optical apparatus according to claim 12, further comprising a polarization selective optical filter arranged to receive the second optical signal output by the optical source and to transmit a portion of the second optical signal having the preselected state of polarization to the optical device.

14. A communications network base station comprising the communications network optical apparatus according to claim 12.

\* \* \* \* \*